United States Patent [19]

Ikeda et al.

[11] Patent Number: 5,270,668
[45] Date of Patent: Dec. 14, 1993

[54] SEMICONDUCTOR AMPLIFIER

[75] Inventors: Yukio Ikeda; Gen Toyoshima; Kiyoharu Seino; Tadashi Takagi, all of Kamakura, Japan

[73] Assignee: Mitsubishi Denki Kabushiki Kaisha, Tokyo, Japan

[21] Appl. No.: 856,446

[22] Filed: Mar. 24, 1992

[30] Foreign Application Priority Data

Mar. 27, 1991 [JP] Japan .................. 3-63005

[51] Int. Cl.$^5$ ............................................. H03F 3/193
[52] U.S. Cl. ...................... 330/286; 330/277; 330/307
[58] Field of Search ................. 330/207 A, 277, 251, 330/286, 306, 307

[56] References Cited

U.S. PATENT DOCUMENTS

| | | | |
|---|---|---|---|
| 4,717,884 | 1/1988 | Mitzlaff | 330/277 X |
| 5,146,178 | 9/1992 | Nojima et al. | 330/277 X |

FOREIGN PATENT DOCUMENTS

| | | | |
|---|---|---|---|
| 58-159002 | 9/1983 | Japan . | |
| 213307 | 9/1987 | Japan | 330/277 |
| 3-128508 | 5/1991 | Japan . | |
| 3-195205 | 8/1991 | Japan . | |
| 1171610 | 11/1969 | United Kingdom . | |

*Primary Examiner*—James B. Mullins
*Attorney, Agent, or Firm*—Wolf, Greenfield & Sacks

[57] ABSTRACT

A small-sized, high-efficiency semiconductor amplifier exhibits a satisfactory efficiency characteristic over a wide band and a low output level for secondary and tertiary higher harmonics. The semiconductor is equipped with an output circuit which is composed of a parallel resonance circuit for the secondary higher harmonic of the fundamental-operation frequency, a first connection line, a second connection line, and an open-end line having a length corresponding to approximately ¼ of the wavelength of the tertiary higher harmonic, the drain terminal of FETs leading to the output circuit being connected to one end of the parallel resonance circuit through the first connection line, an open point being formed at one end of the parallel resonance circuit, the other end of the parallel resonance circuit for the secondary higher harmonic being connected to the open-end line having a length corresponding to approximately ¼ of the wavelength of the tertiary higher harmonic through the second connection line, the length and width of the first connection line being adjusted to determine the secondary-higher-harmonic load-reflection coefficient of the FETs as seen from the drain thereof to such a value as will maximize the efficiency of the amplifier, the length and width of the second connection line being appropriately adjusted so as to adjust the impedance matching conditions with respect to the fundamental wave.

17 Claims, 3 Drawing Sheets 018,668

SEMICONDUCTOR AMPLIFIER

BACKGROUND OF THE INVENTION

1. Field of the Invention

The present invention relates to a semiconductor amplifier for the semi-microwave and microwave bands which is for use in satellite communication, terrestrial microwave communication, mobile body communication or the like.

2. Description of the Related Art

FIG. 3 is a circuit diagram of a conventional semiconductor amplifier disclosed, for example, in Japanese Patent Laid-Open No. 58-159002, "Semiconductor Amplifier for High-Frequency Electric Power". The semiconductor amplifier shown in the drawing includes a field effect transistor (hereinafter referred to simply as "FET") 24, a gate terminal 25, a drain terminal 26, a source terminal 27, a gate bias terminal 28, a drain bias terminal 29, a gate bias application line 30, a drain bias application line 31, an input DC-blocking capacitor 32, an output DC-blocking capacitor 33, an input-side impedance matching line 34, an output-side impedance matching line 35, an input-side impedance matching capacitor 36, an output-side impedance matching capacitor 37, a line 38 having a length corresponding to ¼ of the wavelength of the fundamental wave used, and an R/F short-circuit capacitor 39.

The above conventional semiconductor amplifier operates as follows:

A semi-microwave or microwave signal entered at an input terminal 1 is amplified by the FET 24 and transmitted to an output terminal 2. The output circuit of this semiconductor amplifier is formed by the line 38 having a length corresponding to ¼ of the wavelength of the fundamental wave, the RF short-circuit capacitor 39, the output-side impedance matching line 35, the output-side impedance matching capacitor 37, the output-side DC-blocking capacitor 33, and the drain bias application line 31. The secondary higher harmonic is short-circuited at the drain terminal of the FET by the line 38 having a length corresponding to ¼ of the wavelength of the fundamental wave, thereby allowing the FET to operate at high efficiency. The output-side impedance matching line 35 and the output-side impedance matching capacitor 37 realize an impedance matching in the fundamental wave.

According to a report regarding the prior-art technique, it is effective, for the purpose of making the FET operate at high efficiency, to set the amplitude and the phase of the secondary-higher-harmonic load-reflection coefficient as seen from the drain, which serves as the output terminal, to 1° and −180°, respectively. In the above-described conventional semiconductor amplifier, a front-end short-circuit line having a length corresponding to ¼ of the wavelength of the fundamental wave is employed as a means for satisfying the above conditions.

In the conventional semiconductor amplifier, constructed as described above, the front-end short-circuit line having a length corresponding to ¼ of the wavelength of the fundamental wave, which is used as a secondary-higher-harmonic processing circuit, is rather long, thereby making it difficult to realize the semiconductor amplifier in a small size. Further, due to the loss in the front-end short-circuit line having a length corresponding to ¼ of the wavelength of the fundamental wave and the loss in the RF short-circuit capacitor, the amplitude of the secondary-higher-harmonic load-reflection coefficient is less than 1, resulting in a deterioration in efficiency.

FIG. 4 shows the results of a secondary-higher-harmonic injection experiment using a PHS-type FET having a gate width, for example, of 12.6 mm. The results show the efficiency characteristic of this FET with respect to the phase of the secondary-higher-harmonic load-reflection coefficient. The experiment was performed on four cases in which the amplitude of the secondary-higher-harmonic load-reflection coefficient varied as: 1.4, 1.2, 1.0, and 0.85. As can be seen from the experimental results shown in FIG. 4, the phase of a secondary-higher-harmonic load-reflection coefficient which maximizes the efficiency of the FET is around −150°, which is rather deviated from the above-mentioned requisite condition for the prior-art technique, according to which the amplitude and the phase of the secondary-higher-harmonic load-reflection coefficient should be 1° and −180°, respectively. It is assumed that this is attributable to the incidental impedance or the like in the structure of the semiconductor amplifying element, such as FET, when actually fabricated. Accordingly, it is related to the set position where phase of the secondary-higher-harmonic load-reflection coefficient in the circuit design for driving the semiconductor amplifier device at an optimum efficiency is −180°, i.e., where the short-circuit end is to be positioned in the semiconductor amplifying element. Further, from the experimental results shown in FIG. 4, the phase of the secondary-higher-harmonic load-reflection coefficient maximizing the efficiency is around −150°, which means it is expected to be of a capacitive nature. Further, it can be seen that a maximum efficiency cannot be obtained in the case where there is a loss in the secondary-higher-harmonic processing circuit, as in the above conventional semiconductor amplifier, and where the amplitude of the secondary-higher-harmonic reflection coefficient is 0.85.

From the above results obtained with respect to the PHS-type FET having a gate width of 12.6 mm, it can be seen that in the case where a front-end short-circuit line having a length corresponding to ¼ of the wavelength of the fundamental wave is used, as in the above conventional semiconductor amplifier, it is necessary to provide a long connection line for phase correction between the drain of the FET and the front-end short-circuit line having a length corresponding to ¼ of the wavelength of the fundamental wave in order to realize a secondary-higher-harmonic reflection coefficient having an amplitude of 1° and a phase of −150°, which maximizes the efficiency. As a result, the size of the output circuit has to be rather large. (When, for example, a 900 MHz-band amplifier is to be formed by using an alumina substrate having a dielectric constant of 10, the connection line must extend up to a position which is at a distance of approximately 5.9 mm from the drain of the FET). Further, due to the loss in the above connection line, the absolute value of the secondary-higher-harmonic load-reflection coefficient is substantially smaller than 1, and further, as a result of the elongation of the above connection line, the frequency band where the FET operates at high efficiency becomes narrower.

SUMMARY OF THE INVENTION

This invention has been made with a view toward solving the above problems. In a first aspect of the present invention, the object is to provide a small-sized, high-efficiency semiconductor amplifier in which leakage of the secondary higher harmonic of the fundamental wave used is restrained. In a second aspect of the present invention, the object is to provide a semiconductor amplifier which makes it possible to obtain a large fundamental-wave output and in which leadage of the tertiary higher harmonic of the fundamental wave is restrained.

According to the first aspect of the present invention, there is provided a semiconductor amplifier of the type which includes a higher-harmonic processing circuit, the semiconductor amplifier comprising an output circuit which is equipped with a parallel resonance circuit for the secondary higher harmonic of the fundamental wave used and a first connection line connecting the output terminal of the semiconductor amplifying element leading to the output circuit to the above-mentioned parallel resonance circuit and having a length determined such as to set the secondary-higher-harmonic load-reflection coefficient of the semiconductor amplifying element to a predetermined value.

According to the second aspect of the present invention, there is provided a semiconductor amplifier of the type which includes a higher-harmonic processing circuit, the semiconductor amplifier comprising an output circuit which is equipped with an open-end line having a length corresponding to approximately ¼ of the tertiary higher harmonic of the fundamental wave used and a second connection line connecting the above-mentioned open-end line to the output circuit and effecting impedance matching with respect to the fundamental wave used.

Further, according to a third aspect of the present invention, there is provided a semiconductor amplifier which is formed on a substrate for a monolithic microwave integrated circuit and on a dielectric substrate having hybrid structure.

The semiconductor amplifier according to the first aspect of the present invention, constructed as described above, provides the following effect: In realizing a secondary-higher-harmonic load-reflection coefficient having an amplitude of 1° and a phase of −150°, which is the condition for driving the semiconductor amplifier at high efficiency, the parallel resonance circuit for the secondary higher harmonic of the fundamental wave used, which is provided in the output circuit of the semiconductor amplifier, infinitizes the impedance with respect to the secondary higher harmonic as seen from the end of the parallel resonance circuit, thereby restraining leakage of the secondary higher harmonic of the fundamental wave. Further, the first connection line, which connects the output terminal of the semiconductor amplifying element leading to the output circuit to the above parallel resonance circuit, is made shorter as compared with the conventional semiconductor amplifier, in which an open end short-circuit line having length corresponding to ¼ of the wavelength of the fundamental wave is used a the secondary-higher-harmonic processing circuit. Thus, according to the first aspect of the present invention, a small-sized, high-efficiency semiconductor amplifier can be realized. The same effect is obtained in the case where the secondary-higher-harmonic load-reflection coefficient, which is the condition for driving the semiconductor amplifying element, is of a capacitive nature.

Further, in the semiconductor amplifier according to the second aspect of the present invention, constructed as described above, the length and width of the second connection line, which connects the open-end line having a length corresponding to approximately ¼ of the tertiary higher harmonic of the fundamental wave used to the output circuit, are appropriately adjusted, thereby effecting impedance matching with respect to the fundamental wave used. Further, the impedance of the above-mentioned open-end line, which has a length corresponding to approximately ¼ of the tertiary higher harmonic, is zero as seen from the connection end with respect to the tertiary higher harmonic, so that the tertiary higher harmonic is cut off, thereby making it possible to obtain a large fundamental-wave output and realizing a semiconductor amplifier in which leakage of the tertiary higher harmonic of the fundamental wave is restrained.

DESCRIPTION OF THE PREFERRED EMBODIMENTS

Figure 1:
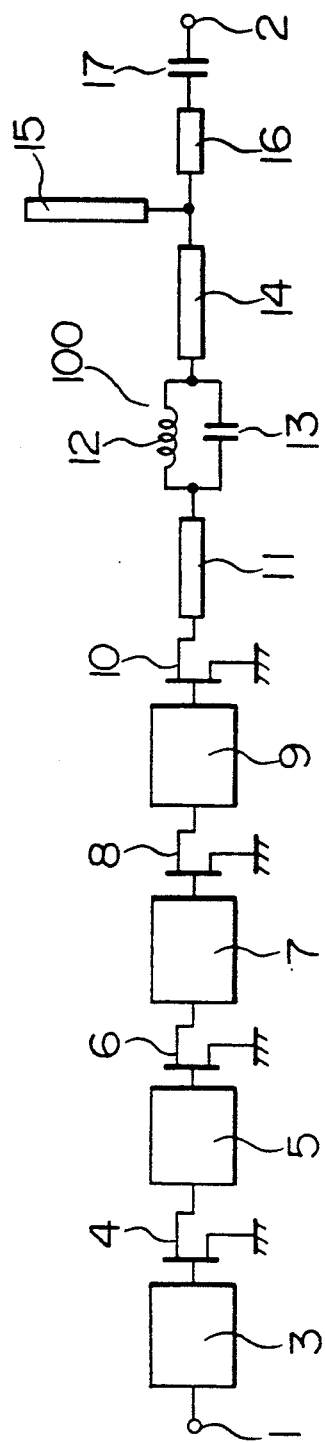
FIG. 1 is an equivalent circuit diagram showing the construction of a semiconductor amplifier according to a first embodiment of the present invention.

FIG. 1 is an equivalent circuit diagram showing the construction of a semiconductor amplifier according to the present invention. In the example shown, a four-stage FET amplifier is used, which is equipped with an output circuit used as a higher-harmonic processing circuit for restraining leakage of the secondary and tertiary higher harmonics of the fundamental wave used. Thus, the example covers the first and second aspects of the present invention. The semiconductor amplifier shown includes an input terminal 1, an output terminal 2, an input matching circuit 3, a first FET 4, a first inter-stage matching circuit 5, a second FET 6, a second inter-stage matching circuit 7, a third FET 8, a third inter-stage matching circuit 9, and a fourth FET 10. The above-mentioned components constitute an amplifying means. The semiconductor amplifier shown further includes a first connection line 11, an inductor 12, a capacitor 13, a second connection line 14, an open-end line 15 having a length corresponding to approximately ¼ of the tertiary higher harmonic, a third connection line 16, and a DC-blocking capacitor 17. Reference numeral 100 indicates a parallel resonance circuit for the secondary higher harmonic of the fundamental wave used, which is composed of the inductor 12 and the capacitor 13. The output circuit (the higher-harmonic processing circuit) of this semiconductor amplifier is formed by the first connection line 11, the parallel resonance circuit 100 for the secondary higher harmonic, the second connection line 14, the open-end line 15 having a length corresponding to approximately ¼ of the tertiary higher harmonic, the third connection line 16, and the DC-blocking capacitor 17. Further, the input matching circuit 3 is provided for the purpose of supplying signals to the first FET 4 in a n effective manner. The first, second and third inter-stage matching circuits 5, 7 and 9 are provided for the purpose of realizing an inter-stage impedance matching.

Next, the operation of this semiconductor amplifier will be described.

A signal entered at the input terminal 1 is amplified by the first, second, third and fourth FETs 4, 6, 8 and 10, and transmitted to the output terminal 2 by way of the output circuit. Hence, due to the parallel resonance circuit 100, an open point with respect to the secondary higher harmonic is generated at the position where the first connection line 11 and the parallel resonance circuit 100 for the secondary higher harmonic are connected to each other, and, by appropriately adjusting the lenght and width of the first connection line 11, it is possible to set the secondary-higher-harmonic load-reflection coefficient as seen from output terminal of the fourth FET 10 to such a value as will maximize the efficiency of the semiconductor amplifier. Further, the open-end line 15 having a length corresponding to approximately ¼ of the tertiary higher harmonic reduces the impedance with respect to the tertiary higher harmonic as seen from the connection point due to the second connection line 14 to zero, so that the tertiary higher harmonic is cut off. Thus, impedance matching in the fundamental wave can be realized by appropriately adjusting the length and width of the second connection line 14.

In accordance with the above-described embodiment, the parallel resonance circuit 100 for the secondary higher harmonic causes an open point to be generated at the position where the first connection line 11 and the parallel resonance circuit 100 for the secondary higher harmonic are connected with to each other, and, by appropriately adjusting the length and width of the first connection line 11, the secondary-higher-harmonic load-reflection coefficient as seen from the output terminal of the fourth FET 10 can be set to such a value as will maximize the efficiency of the amplifier. Thus, as compared with the conventional semiconductor amplifier, in which an open-end short-circuit line having a length corresponding to ¼ of the wavelength of the fundamental wave is used as the secondary-higher-harmonic processing circuit, the first connection line 11 of this embodiment can be made shorter, thereby attaining a reduction in size and realizing a secondary-higher-harmonic processing over a wide band. Further, the decrease in amplitude of the secondary-higher-harmonic load-reflection coefficient due to the loss in the connection line is mitigated, thereby attaining an improvement in efficiency. Furthermore, since the impedance matching circuit for the fundamental wave used is formed by the second connection line 14 and the open-end line having a length corresponding to approximately ¼ of the wavelength of the tertiary higher harmonic, it is possible to obtain a large fundamental-wave output and to provide a semiconductor amplifier in which leakage of the tertiary higher harmonic is restrained.

Figure 2:
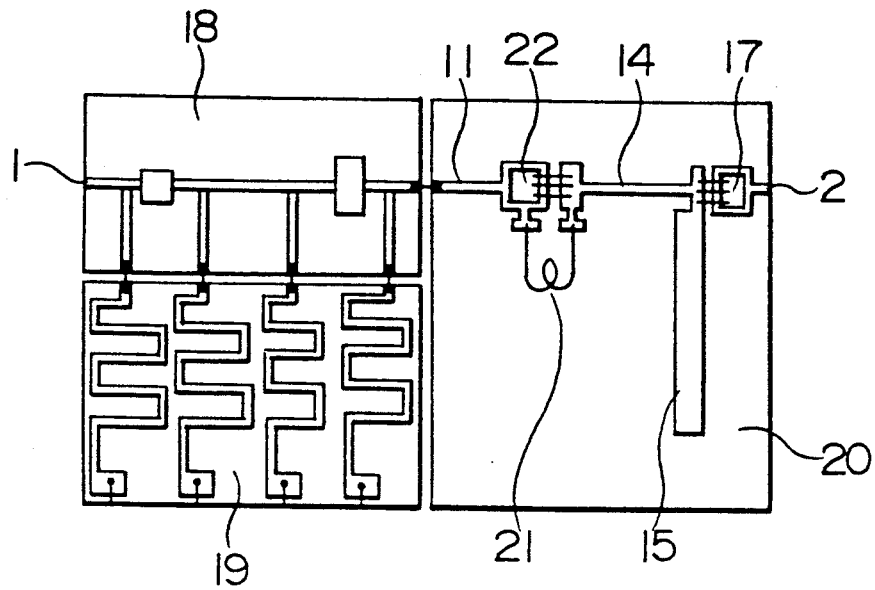
FIG. 2 is a schematic diagram showing the construction of a semiconductor amplifier according to a second embodiment of the present invention actually fabricated.
Figure 3:
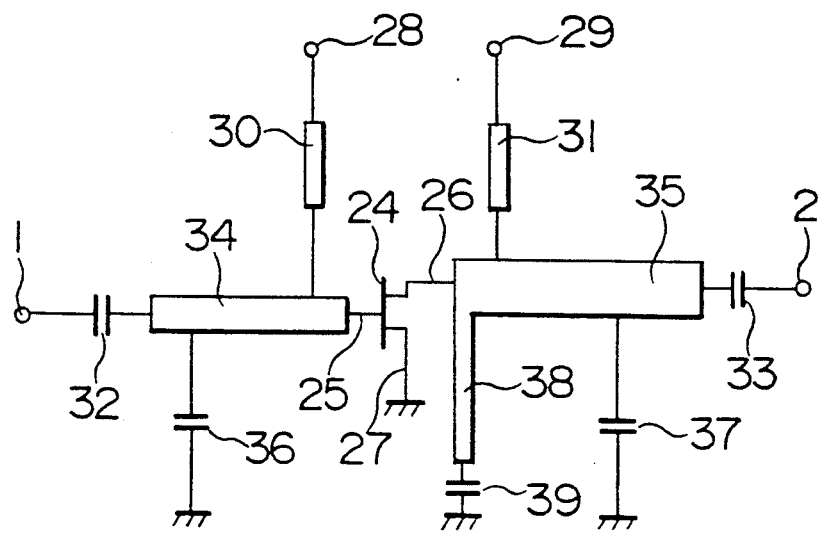
FIG. 3 is an equivalent circuit diagram showing the construction of a conventional semiconductor amplifier.
Figure 4:
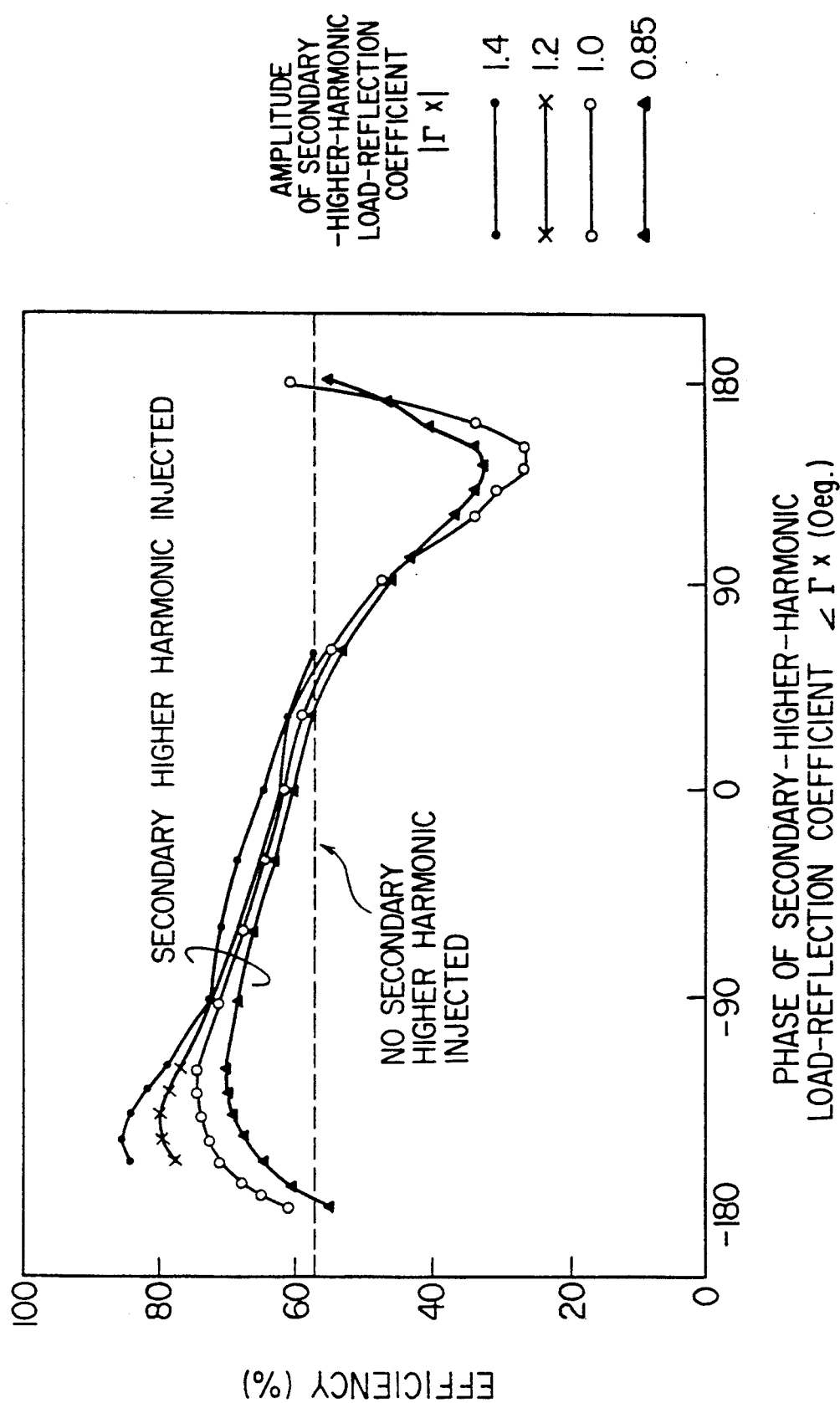
FIG. 4 is a diagram showing the results of a secondary-higher-harmonic injection experiment using an FET to obtain the efficiency characteristic thereof with respect to the phase of the secondary-higher-harmonic load-reflection coefficient for the purpose of illustrating the designing concept of the semiconductor amplifier of the present invention.

FIG. 2 shows the construction of a semiconductor amplifier according to the third aspect of the present invention actually fabricated. The construction of this semiconductor amplifier is substantially the same as the one described above. In the drawing, numeral 18 indicates a first monolithic-microwave-integrated-circuit substrate constituting the semiconductor amplifying element and a part of a passive-circuit element; numeral 19 indicates a second monolithic-microwave-integrated-circuit substrate constituting the passive-circuit element only; numeral 20 indicates a dielectric substrate constituting an output circuit; numeral 21 indicates a gold wire realizing the inductor 12 of the parallel resonance circuit 100 for the secondary higher harmonic; and numeral 22 indicates a chip capacitor realizing the capacitor 13 of the parallel resonance circuit 100 for the secondary higher harmonic. Provided on the first monolithic-microwave-integrated-circuit substrate 18 are the first, second, third and fourth FETs 4, 6, 8 and 10, and a part of the passive-circuit element constituting the input matching circuit 3, and the first, second and third inter-stage matching circuits 5, 7 and 9. Provided on the second monolithic-microwave-integrated-circuit substrate 19 is the passive-circuit element constituting the input matching circuit 3, the first, second and third inter-stage matching circuits 5, 7 and 9, and, further, a bias circuit. Provided on the dielectric substrate 20 are the components of the output circuit, i.e., the first connection line 11, the inductor 12, the capacitor 13, the second connection line 14, the open-end line 15 having a length corresponding to approximately ¼ of the wavelength of the tertiary higher harmonic, and the DC-blocking capacitor 17 consisting of a chip capacitor. The above-mentioned three substrates are connected with each other at predetermined positions by gold wires.

In accordance with this embodiment, it is possible to attain, apart from the effects of the above first embodiment, a reduction in size because of the formation of the first to the fourth FETs of the four-stage amplifier by utilizing a monolithic microwave integrated circuit. Further, since the output circuit is formed in a hybrid structure using a dielectric substrate of alumina or the like, it is possible to mitigate the loss in the first connection line 11, the second connection line 14 constituting the fundamental-wave impedance matching circuit, and the open-end line 15 having a length corresponding to approximately ¼ of the wavelength of the tertiary higher harmonic. Thus, in accordance with this embodiment, it is possible to obtain a large fundamental-wave output and to mitigate the decrease in amplitude of the secondary-higher-harmonic load-reflection coefficient, thereby attaining an improvement in efficiency.

Although the above embodiments have been described with reference to a four-stage FET semiconductor amplifier, the present invention is also applicable to a semiconductor amplifier of any number of stages.

Thus, as compared with the conventional semiconductor amplifier, in which a front-end short-circuit line having a length corresponding to ¼ of the wavelength of the fundamental wave is used as the secondary-higher-harmonic processing circuit, it is possible, with the semiconductor amplifier according to the first aspect of the present invention, to reduce the length of the connection line, thereby making it possible to obtain a small-sized, high-efficiency semiconductor amplifier.

Further, according to the second aspect of the present invention, it is possible to provide a semiconductor amplifier which helps to obtain a large fundamental-wave output and in which leakage of the tertiary higher harmonic of the fundamental wave is restrained.

What is claimed is:

1. A semiconductor amplifier of the type which has a higher-harmonic processing function, said semiconductor amplifier comprising:

amplifying means for effecting amplification; and higher-harmonic processing means including a parallel resonance circuit for a secondary higher harmonic of a fundamental wave used and a first connection line connecting said parallel resonance circuit to an output side of said amplifying means and having a length and a width which are determined such as to set a secondary-higher-harmonic load-reflection coefficient of said amplifying means to a predetermined value, and restraining leakage of the secondary higher harmonic.

2. A semiconductor amplifier as claimed in claim 1 wherein said higher-harmonic processing means is further equipped with an open-end line having a length corresponding to approximately ¼ of the wavelength of a tertiary higher harmonic of said fundamental wave and a second connection line connecting said open-end line to said parallel resonance circuit and having a length and a width which are determined such as to effect impedance matching with respect to said fundamental wave, thereby also restraining leakage of the tertiary higher harmonic of said fundamental wave.

3. A semiconductor amplifier as claimed in claim 2 wherein said amplifying means further includes an input terminal for accepting semi-microwave and microwave signals to be amplified, an input matching circuit connected to said input terminal, a plurality of serially connected amplifying elements connected to said input matching circuit, and an inter-stage matching circuit between a first amplifying element and a second amplifying element; and wherein said higher-harmonic processing means further includes a DC-blocking capacitor having two ends, a third connection line connecting one end of said DC-blocking capacitor to a connection point between said second connection line and said open-end line, and an output terminal connected to the other end of said DC-blocking capacitor.

4. A semiconductor amplifier for amplifying a signal having a fundamental frequency, comprising:

a first assembly including a first substrate, an input terminal mounted to the first substrate, at least one semiconductor amplifying element having a first amplifying element input and a last amplifying element output, the at least one semiconductor amplifying element embedded in the first substrate, and a first portion of an input matching circuit connected between the input terminal and the first amplifying element input;

a second assembly including a second substrate and a second portion of said input matching circuit;

a third assembly including a dielectric substrate, parallel resonance circuit means for resonating at a secondary higher harmonic of the fundamental frequency, a first connection line connecting said parallel resonance circuit means to the last amplifying element output, the first connection line having a length and a width which are selected so as to set a secondary-higher-harmonic load-reflection coefficient of the at least one semiconductor amplifying element to a predetermined value, an open-end line having a length corresponding to approximately ¼ of the wavelength of a tertiary higher harmonic of said fundamental frequency, a second connection line connecting said open-end line to said parallel resonance circuit means, the second connection line having a length and a width which are determined such as to effect impedance matching with respect to said fundamental frequency, a DC-blocking chip capacitor connected to a connection point between said second connection line and said open-end line, and an output terminal connected to said chip capacitor; and means for electrically connecting said first substrate to said second substrate.

5. A semiconductor amplifier as claimed in claim 4, wherein the first substrate is a monolithic-microwave-integrated-circuit substrate.

6. A semiconductor amplifier as claimed in claim 4 wherein the second substrate is a monolithic-microwave-integrated-circuit substrate.

7. A semiconductor amplifier as claimed in claim 4, wherein said means for electrically connecting said first substrate to said second substrate includes gold wires.

8. A semiconductor amplifier as claimed in claim 4, wherein the parallel resonance circuit means includes a chip capacitor and a gold wire inductor connected in parallel.

9. A semiconductor amplifier for amplifying a signal having a fundamental frequency, comprising:

amplifying means, including an amplifying means output, for amplifying the signal; and higher-harmonic processing means including (i) parallel resonance circuit means for resonating at a secondary higher harmonic of the fundamental frequency, and (ii) a first connection line connecting said amplifying means output to said parallel resonance circuit means, the first connection means having a length and a width which are selected so as to set a secondary-higher-harmonic load-reflection coefficient of said amplifying means to a predetermined value, so as to restrain leakage of the secondary higher harmonic of the fundamental frequency.

10. A semiconductor amplifier as claimed in claim 9 wherein said higher-harmonic processing means further includes (iii) an open-end line having a length corresponding to approximately ¼ of a wavelength of a tertiary higher harmonic of said fundamental frequency and (iv) a second connection line connecting said open-end line to said parallel resonance circuit means, said open-end line having a length and a width which are selected so as to effect impedance matching at said fundamental frequency, and so as to restrain leakage of a tertiary higher harmonic of said fundamental frequency.

11. A semiconductor amplifier as claimed in claim 10 wherein said amplifying means further includes an input terminal for accepting the signal, an input matching circuit connected to said input terminal, a first semiconductor amplifying element connected to said input matching circuit, a second semiconductor amplifying element, and a first interstage matching circuit, the interstage matching circuit connected between the first semiconductor amplifying element and the second semiconductor amplifying element.

12. A semiconductor amplifier as claimed in claim 11 wherein said amplifying means further includes a plurality of semiconductor amplifying elements, each semiconductor amplifying element connected to the next by an interstage matching circuit.

13. A semiconductor amplifier as claimed in claim 10 wherein said higher-harmonic processing means further includes a DC-blocking capacitor having two ends, and a third connection line, the third connection line connecting one end of said DC-blocking capacitor to a connection point between said second connection line and said open-end line.

14. A semiconductor amplifier for amplifying a signal having a fundamental frequency, comprising:

a first assembly including a first substrate, an input terminal mounted to the first substrate, a plurality of semiconductor amplifying elements, each semiconductor amplifying element connected to the next by an interstage matching circuit, the plurality of semiconductor amplifying elements having a first amplifying element input and a last amplifying element output, the plurality of semiconductor amplifying elements embedded in the first substrate, and a first portion of an input matching circuit connected between the input terminal and the first amplifying element input;

a second assembly including a second substrate and a second portion of said input matching circuit;

means for electrically connecting said first substrate to said second substrate.

15. A semiconductor amplifier for amplifying a signal having a fundamental frequency, comprising:

a first assembly including a first substrate, an input terminal mounted to the first substrate, at least one semiconductor amplifying element having a first amplifying element input and a last amplifying element output, the at least one semiconductor amplifying element embedded in the first substrate, and a first portion of an input matching circuit connected between the input terminal and the first amplifying element input;

a second assembly including a second substrate and a second portion of said input matching circuit;

a third assembly including a dielectric substrate, parallel resonance circuit means, mounted to the dielectric substrate, for resonating at a secondary higher harmonic of the fundamental frequency, and a first connection line connecting said parallel resonance circuit means to the last amplifying element output, the first connection line having a length and a width which are selected so as to set a secondary-higher-harmonic load-reflection coefficient of the at least one semiconductor amplifying element to a predetermined value; and means for electrically connecting said first substrate to said second substrate.

16. A semiconductor amplifier for amplifying a signal having a fundamental frequency, comprising:

a first monolithic-microwave-integrated-circuit having an input terminal, at least one semiconductor amplifying element with a first amplifying element input and a last amplifying element output, and an input matching circuit connected between the input terminal and the first amplifying element input;

a filter circuit including a dielectric substrate, parallel resonance circuit means for resonating at a secondary higher harmonic of the fundamental frequency, a first connection line connecting said parallel resonance circuit means to the last amplifying element output, the first connection line having a length and a width which are selected so as to set a secondary-higher-harmonic load-reflection coefficient of the at least one semiconductor amplifying element to a predetermined value, an open-end line having a length corresponding to approximately ¼ of the wavelength of a tertiary higher harmonic of said fundamental frequency; and means for electrically connecting said first monolithic-microwave-integrated-circuit to said filter circuit.

17. A semiconductor amplifier as claimed in claim 16, wherein the filter circuit further includes a second connection line connecting said open-end line to said parallel resonance circuit means, the second connection line having a length and a width which are determined such as to effect impedance matching with respect to said fundamental frequency, a DC-blocking chip capacitor connected to a connection point between said second connection line and said open-end line, and an output terminal connected to said chip capacitor.

* * * * *